United States Patent [19]
Markle et al.

[11] 3,957,364
[45] May 18, 1976

[54] COARSE VIEWING SYSTEM FOR AN ANNULAR FIELD PROJECTION SYSTEM

[75] Inventors: David A. Markle; Jere D. Buckley, both of Norwalk; Raul E. Casas, Danbury, all of Conn.

[73] Assignee: The Perkin-Elmer Corporation, Norwalk, Conn.

[22] Filed: Sept. 26, 1974

[21] Appl. No.: 509,597

[52] U.S. Cl. ................................. 353/28; 353/99; 350/27; 350/294
[51] Int. Cl.² ......................................... G03B 21/28
[58] Field of Search ................ 353/28, 98, 99, 102; 350/27, 294, 299, 300, 301–309, 9

[56] References Cited
UNITED STATES PATENTS

| | | | |
|---|---|---|---|
| 2,482,115 | 9/1949 | Laird | 350/294 |
| 3,598,468 | 8/1971 | Perry | 350/27 |
| 3,667,827 | 6/1972 | Lawrence | 350/27 |

OTHER PUBLICATIONS
R-RCA Technical Notes, Antenna with Semi-Transparent Reflector, P. Foldes, RCA TN No: 539, 3/62.

*Primary Examiner*—Houston S. Bell, Jr.
*Assistant Examiner*—A. J. Mirabito
*Attorney, Agent, or Firm*—S. A. Giarratana; F. L. Masselle; J. K. Conant

[57] ABSTRACT

A viewing system for an annular projection system, particularly useful to provide a view of a semiconductor wafer on which an image of a integrated circuit mask pattern has been projected using an annular field projection system in which the field of view can be as large as the large dimension of that portion of the annular region subtended by the wafer thereby permitting ideal coarse alignment of the mask and wafer. The system further includes means to illuminate the mask and wafer separately and in different colors to thereby simplify the distinction of one from the other in the combined image thus facilitating the alignment task.

10 Claims, 1 Drawing Figure

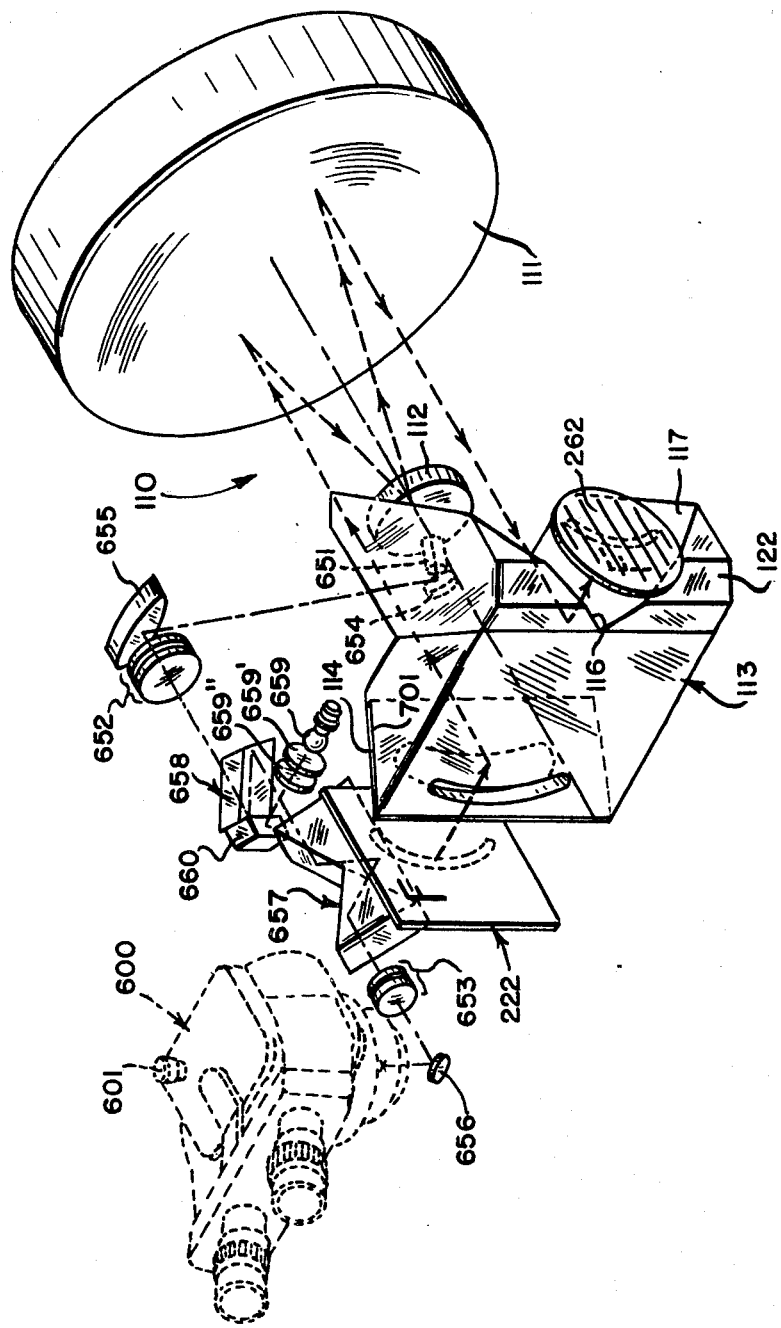

COARSE VIEWING SYSTEM FOR AN ANNULAR FIELD PROJECTION SYSTEM

BACKGROUND OF THE INVENTION

This invention relates to optical apparatus in general, and more particularly to an improved coarse viewing system for an annular field projection system.

In copending applicaton Ser. No. 339,860 filed Mar. 9, 1973 and assigned to the same assignee as the present invention, an optical projecting and scanning apparatus useful in producing integrated circuits is disclosed. The disclosed apparatus requires alignment between a mask and a semiconductor wafer. Alignment is carried out by an operator who adjusts controls to effect relative motion between the wafer and mask. However, in order for the operator to properly carry out this alignment, he must be able to observe the results of the movement which he causes at the wafer. The aforementioned application discloses two viewing systems for making such alignment.

A fine alignment system which permits simultaneous viewing of two points on the wafer or other object is disclosed in the aforementioned copending applicaton Ser. No. 339,860 and is also disclosed and claimed in application Ser. No. 509,587 of W. H. Newell filed Sept. 26, 1974 now U.S. Pat. No. 3,937,556. However, before such fine alignment can be efficiently carried out, a coarse alignment is required. That coarse alignment apparatus is disclosed and claimed herein.

SUMMARY OF THE INVENTION

The present invention deals with coarse alignment apparatus useful in an optical projection and scanning apparatus such as that disclosed in the aforementioned copending application Ser. No. 339,860. Its purpose is to provide a veiw of a wafer on which an image of the mask pattern has been projected using an annular field projection system. With the arrangement of the present invention, the field of view can be as large as the large dimension of that portion of the annulus subtended by the wafer. It thus affords an ideal means of obtaining coarse alignment of the mask and wafer. Also disclosed are means to illuminate the mask and wafer separtately in different colors thereby simplying the distinction of the one from the other in the combined image. This then facilitates the alignment task considerably.

This is accomplished by the combination of a reflective projection system having a dichroic secondary mirror coating, a short focal length objective lens just behind the secondary mirror and tilted with respect to the projection axis, and a relay lens system conveying the demagnified objective image to the eye of the operator. Illumination in separate and different colors is obtained through the use of a beam splitting surface.

BRIEF DESCRIPTION OF THE DRAWINGS

The single FIGURE is a perspective view of a coarse viewing system according to the present invention.

DETAILED DESCRIPTION OF THE PREFERRED EMBODIMENT

The coarse viewing system of the present invention, illustrated on the single FIGURE, is used for viewing the image on a wafer 262 of a mask 222. LIght from an illumination system more fully disclosed in the aforementioned U.S. patent application Ser. No. 339,860 passes through the mask 222 to a reflecting surface 114, then to a primary mirror 111 of a unity magnification imaging system 110. Light is reflected from mirror 111 to a secondary mirror 112 and then, after reflection by surfaces 117 and 116 of a mirror array 113, to the wafer 262.

The coarse viewing system provides a view of the image of the entire mask and of the entire wafer at once, or at least of a major fraction of each. The image of the mask at the wafer produced by the image system 110 (ie., by reflecting face of plone reflector plate 701 of mirror array 113, by the mirrors 111 and 112 and by the reflecting faces 116 and 117) and also the wafer itself, are examined with the aid of an optical system which comprises successively the roof surfaces 116 and 117, the primary mirror 111, three sets of relay lenses 651, 652 and 653, and finally the binocular eyepiece 600 together with plane mirrors 654, 655 and 656 and a number of additional elements to be mentioned presently.

To permit functioning of the coarse viewing system, the secondary mirror 112 of the unity magnification imaging system 110 is provided on its convex surface in confronting station to the mirror 111 with a dichroic coating having a high reflectivity in the ultraviolet spectrum and, desirably, a reflectivity of some 50% and a transmission of some 50% in the visible spectrum. A prism 658 is included to fold and shorten the light path. A derotating prism 657 is inserted to permit presentation of the image to the observer in a suitably oriented azimuthal position. The relay lens set 651 located immediately behind secondary mirror 112 (i.e., adjacent and on the opposite side of mirror 112 with respect to mirror 111) focal length away from the secondary apex which is at the projection system pupil. Thus, the relay lens group 651 reimages the pupil somewhere between infinity and the relay lens group 652 thereby reducing the field and aperture requirements of the remaining relay groups. The remainder of the optical system is used to re-image the image plane at a convenient point for the eye-piece and to provide the required magnification and exit pupil location. Relay lens group 652, for example, will have approximately a 1 to 1 magnification and relay lens group 653 a 3 to 1 magnification.

To permit illumination of the wafer in a color contrasting with that in which the image of the mask is presented by the normal illumination system, a lamp 659 with an associated condensing lens 659' and filter 659" is positioned to illuminate a prism 660 attached to prism 658 and having a beam-splitting surface therein. Light from the lamp 659 thus passes successively to the relay lens combinations 652 and 651, through mirror 112 to mirror 111, and thence via reflecting faces 116 and 117 to illuminate the wafer 262.

The binocular eyepiece may be of variable magnification type with a zoom control 601. To obtain the necessary color contrast for help in distinguishing between the mask and the wafer, filter 659" should be selected to provide different spectral characteristics than the filter associated with the normal illumination system described in the aforementioned patent application Ser. No. 339,860. In this way, a good color contrast between the image detail actually on the wafer and that which is projected onto the wafer from the mask through the projection system is obtained.

Thus, a coarse viewing system for an annular field projection system has been shown. Although a specific embodiment has been illustrated and described, it will be obvious to those skilled in the art that various modifications may be made without departing from the spirit of the invention which is intended to be limited solely by the appended claims.

What is claimed:

1. In an annular field projection system wherein an image is projected onto an object, a coarse viewing system for viewing the object and image thereon comprising:
   a. a primary mirror and a relatively smaller secondary mirror, said mirrors having concave and convex reflective surfaces, respectively, disposed in confronting relation and concentric with respect to an optical axis, the reflective surface of the secondary mirror being formed by a dichroic beam splitting coating;
   b. a short focal length objective lens disposed adjacent said secondary mirror and on the opposite side thereof with respect to said primary mirror, said lens being tilted with respect to said axis; and
   c. a relay lens system for conveying the image formed by said objective lens to the eye of an operator.

2. Apparatus according to claim 1 and further including:
   a. a beam splitting surface; and
   b. means to provide an illumination input to said beam splitting surface to illuminate said object independently of the illumination of said projected image.

3. Apparatus according to claim 1 wherein said relay lens system comprises first and second lens groups.

4. Apparatus according to claim 3 including a binocular eye-piece, said first and second lens groups providing an image input to said eye-piece.

5. Apparatus according to claim 3 wherein said first lens group has a magnification of approximately 1 : 1 and said second lens group 3 : 1 magnification.

6. Apparatus according to claim 3 and further including a prism between said first and second lens group for providing a convenient fold for packaging the overall system.

7. Apparatus according to claim 6 and further including a derotating prism and said second lens group.

8. Apparatus according to claim 7 and further including:
   a. a beam splitting surface; and
   b. means to provide an illumination input to said beam splitting surface to illuminate said object independently of the illumination of said projected image.

9. Apparatus according to claim 7 and further including a beam splitting prism associated with said first prism and means to provide an illumination input to said beam splitting prism independently of the illumination of said projected image.

10. Apparatus according to claim 1 wherein said secondary mirror is coated to be highly reflective in the ultra-violet region and 50% reflective, 50% transmissive in the visible region.

* * * * *